(12) United States Patent
Maki et al.

(10) Patent No.: US 7,447,058 B2
(45) Date of Patent: Nov. 4, 2008

(54) WRITE MARGIN OF SRAM CELLS IMPROVED BY CONTROLLING POWER SUPPLY VOLTAGES TO THE INVERTERS VIA CORRESPONDING BIT LINES

(75) Inventors: Yasuhiko Maki, Kawasaki (JP); Koji Shimosako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 321 days.

(21) Appl. No.: 11/341,429

(22) Filed: Jan. 30, 2006

(65) Prior Publication Data
US 2007/0081407 A1  Apr. 12, 2007

(30) Foreign Application Priority Data
Oct. 12, 2005  (JP) .............................. 2005-297970

(51) Int. Cl.
*G11C 11/00* (2006.01)
(52) U.S. Cl. .................. 365/154; 365/226; 365/229
(58) Field of Classification Search ................. 365/154, 365/226, 229
See application file for complete search history.

(56) References Cited

U.S. PATENT DOCUMENTS 6,804,153 B2 * 10/2004 Yoshizawa et al. ...... 365/189.15
7,092,280 B2 * 8/2006 Joshi .......................... 365/154

FOREIGN PATENT DOCUMENTS

| JP | 58-211391 A | 12/1983 |
|----|-------------|---------|
| JP | 09-051042 A | 2/1997  |

* cited by examiner

*Primary Examiner*—VanThu Nguyen
(74) *Attorney, Agent, or Firm*—Arent Fox LLP.

(57) ABSTRACT

Each memory cell has a pair of inverters whose inputs and outputs are connected to each other and holds complementary data respectively in storage nodes which are outputs of the inverters. In a write operation during which the complementary data are written to the storage nodes respectively, the power control circuit sets a power supply voltage of the inverter having the storage node to which low level is written lower than a power supply voltage of the inverter having the storage node to which high level is written. Since power supply capability to the inverter having the storage node to which the low level is written lowers, the voltage of the storage node easily changes to the low level. That is, a write margin of a memory cell can be improved.

7 Claims, 9 Drawing Sheets

WRITE MARGIN OF SRAM CELLS IMPROVED BY CONTROLLING POWER SUPPLY VOLTAGES TO THE INVERTERS VIA CORRESPONDING BIT LINES

CROSS REFERENCE TO RELATED APPLICATION

This application is based upon and claims the benefit of priority from Japanese Patent Application No. 2005-297970, filed on Oct. 12, 2005, the entire contents of which are incorporated herein by reference.

BACKGROUND OF THE INVENTION

1. Field of the Invention

The present invention relates to a semiconductor memory constituted of memory cells having complementary storage nodes.

2. Description of the Related Art

Along with miniaturization of the device structure of a semiconductor, an insulator film constituting a transistor has been going thinner. Accordingly, reliability of the transistor has been on the decrease. A power supply voltage supplied to a semiconductor integrated circuit has been lowering year by year in order to prevent the decrease in the reliability. When the power supply voltage lowers to be less different from a threshold voltage of the transistor, the transistor is not easily turned on. Accordingly, a write margin or a read margin of a memory cell has been reducing.

There is a proposed technique for improving the read margin of a memory cell in an SRAM by making larger a difference between a power supply voltage supplied to a memory cell and a ground voltage during a read operation than during a standby time (for example, disclosed in Japanese Unexamined Patent Application Publication No. Sho 58-211391). Also, there is another proposed technique for improving the write margin and the read margin of a memory cell by supplying a power supply voltage boosted in a booster to a memory cell during a standby time and stopping the supply of the power supply voltage to the memory cell during an access time to the memory cell (for example, disclosed in Japanese Unexamined Patent Application Publication No. Hei 9-51042). Specifically, a switch (pMOS transistor) that turns on during the standby time and turns off during the access time is provided between a power supply line and the memory cell.

The above-described two techniques, however, require an exclusive power supply line in addition to an ordinary power supply line and a ground line. It also requires a circuit generating a voltage supplied to the exclusive power supply line. This increases circuit scale of a semiconductor memory, leading to cost increase. Further, according to the above-described first technique, the increase in the difference between the power supply voltage supplied to the memory cell and the ground voltage may possibly lower reliability because a high voltage is applied to a transistor constituting the memory cell. The above-described second technique involves a possibility that data already held in the memory cell is lost due to the stop of the supply of the power supply voltage during the read access time to the memory cell. Besides, the switches that turns off during the access time have to be formed for word lines respectively, in order to prevent the loss of the data held in memory cells connected to unselected word lines.

SUMMARY OF THE INVENTION

It is an object of the present invention to improve a write margin of a memory cell, in particular, to improve a write margin of a memory cell without any increase in circuit scale.

According to one embodiment of the present invention, each of memory cells has a pair of inverters whose inputs and outputs are connected to each other, and holds complementary data respectively in storage nodes which are the outputs of the inverters. In a write operation during which the complementary data are written to the storage nodes respectively, a power control circuit sets a power supply voltage of the inverter having the storage node to which low level is written, to be lower than a power supply voltage of the inverter having the storage node to which high level is written. This decreases power supply capability to the inverter having the storage node to which the low level is written, so that the voltage of this storage node easily changes to the low level. That is, the write margin of the memory cell can be improved.

In a preferable example of the embodiment of the present invention, complementary bit lines are connected to the storage nodes of the inverters via transfer switches, respectively. The power control circuit receives write voltages supplied to the bit lines, to supply the power supply voltage to each of the inverters according to the received write voltages. According to this invention, the power supply voltages supplied to the inverters can be automatically controlled by utilizing the voltages of the bit lines. Since it is not necessary to have a circuit generating a special control signal for putting the power control circuit into operation and a control signal line through which the control signal is transmitted, it is possible to suppress the increase in circuit scale to a minimum, improving the write margin of the memory cell.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described, using the drawings. In the drawings, each signal line shown by the heavy line is constituted of a plurality of lines. Further, part of blocks to which the heavy line is connected is constituted of a plurality of circuits. Each signal line through which a signal is transmitted is denoted by the same reference numeral as that of the signal name. Each signal starting with "/" indicates negative logic. Each signal ending with "X" indicates negative logic.

Figure 1:
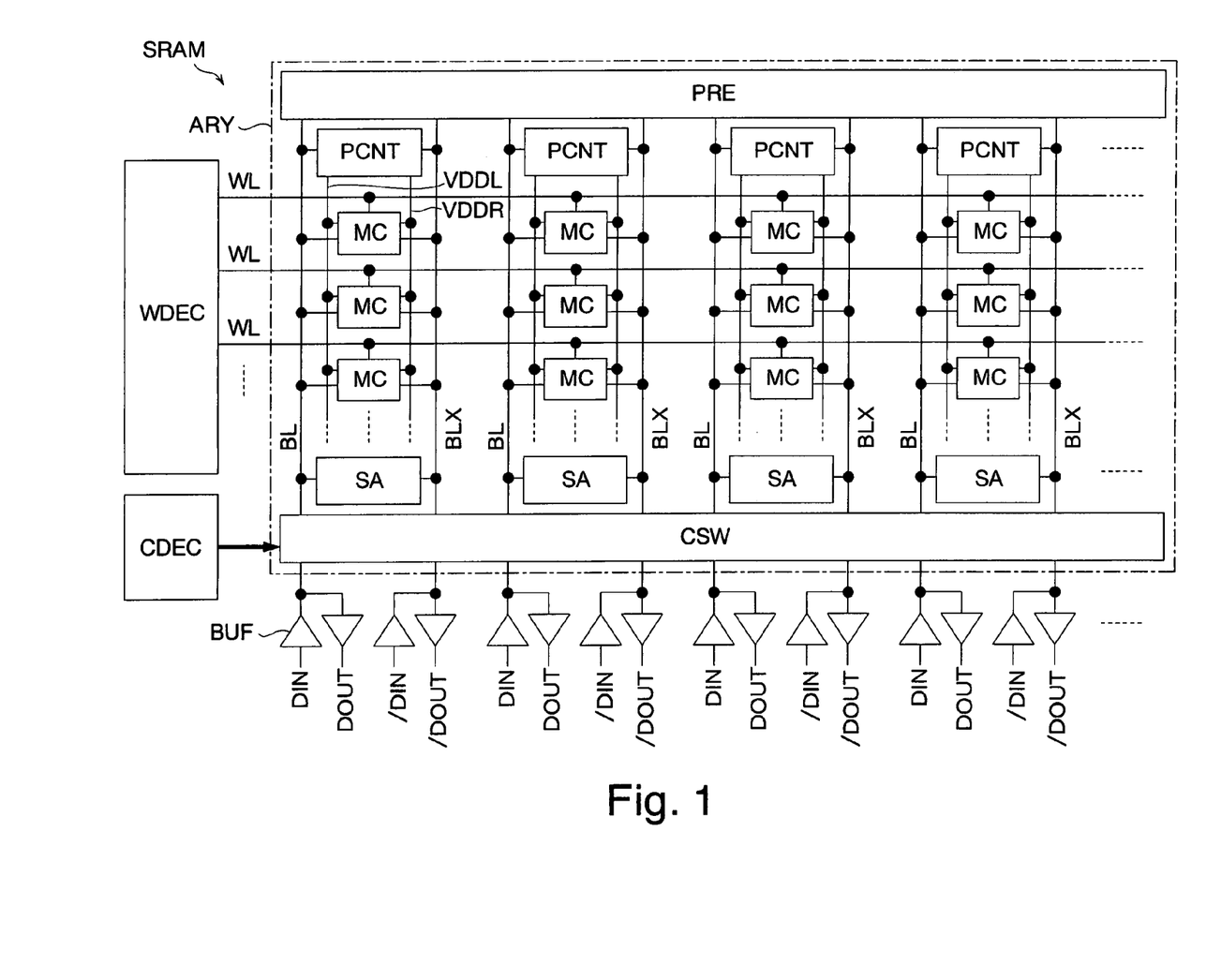
FIG. 1 is a block diagram showing a first embodiment of the present invention.

FIG. 1 shows a first embodiment of a semiconductor memory of the present invention. This semiconductor memory is formed as a SRAM having static memory cells MC by using CMOS technology. The SRAM has a memory cell array ARY, a word decoder WDEC, and a column decoder CDEC. The memory cell array ARY has a precharge circuit PRE, power control circuits PCNT, memory cells MC, sense amplifiers SA, a column switch CSW, word lines WL, and complementary bit lines BL, BLX. In addition to the shown elements, the SRAM has elements (not shown) such as an operation control circuit controlling the operation timings of the word decoder WDEC, the column decoder CDEC, the precharge circuit PRE, the sense amplifiers SA, and the column switch CSW, The word decoder WDEC activates one of the word lines WL from low level to high level according to an externally supplied address signal (row address) during a read operation and a write operation. The column decoder CDEC activates a column selection signal CL for turning on one of column switches, from low level to high level according to an externally supplied address signal (column address) during the read operation and the write operation.

The precharge circuit PRE has a plurality of transistor switches (not shown) connecting the bit lines BL, BLX to power supply lines. The precharge circuit PRE precharges the bit lines BL, BLX to an external supply voltage VDD (high level) in a standby period during which the memory cells MC are not accessed. Here, the external supply voltage VDD is a power supply voltage supplied from an external part of the memory cell array ARY. The power supply voltage VDD may be supplied from an external part of the SRAM or may be generated inside the SRAM. The standby period is a period during which neither the write operation nor the read operation is executed, and is a period during which the word lines WL are inactivated to the low level.

The memory cells MC are arranged in matrix in the memory cell array ARY and are connected to the bit line pairs BL, BLX and the word lines WL. The memory cells MC arranged in line in the vertical direction in the drawing are connected to the same bit line pair BL, BLX. The memory cells MC arranged in line in the horizontal direction in the drawing are connected to the same word line.

The power control circuits PCNT are formed for respective columns in each of which the memory cells MC are arranged in line in the vertical direction in the drawing. Each of the power control circuits PCNT sets one of power supply voltages VDDL, VDDR (internal power supply voltages), which are to be supplied to the memory cell MC according to the voltages of the bit lines BL, BLX, lower than the external supply voltage VDD. That is, the operation of the power control circuits PCNT is automatically controlled according to the voltages of the bit lines BL, BLX. The present invention does not require any circuit generating a special control signal for putting the power control circuits PCNT into operation, or any control signal line through which the control signal is transmitted. Therefore, an increase in circuit scale of the SRAM due to the application of the present invention can be reduced to the minimum.

Power supply lines VDDL, VDDR (internal power supply lines) are arranged along the bit lines BL, BLX. Similarly to the sense amplifiers SA, the power control circuits PCNT are preferably formed on one side of the bit line pairs BL, BLX since they operate according to the voltages of the bit lines BL, BLX. This can prevent the length of the wiring of the bit lines BL, BLX from increasing when the power control circuits PCNT are formed. Forming each of the power control circuits PCNT commonly for the plural memory cells connected to one bit line pair BL, BLX can minimize the number of the power control circuits PCNT. For the above-described reasons, it is possible to minimize the increase in circuit scale of the SRAM. The power control circuit PCNT will be described in detail later with reference to FIG. 2.

The sense amplifiers SA are formed for the respective bit line pairs BL, BLX. Each of the sense amplifiers SA differentially amplifies a voltage difference between the bit lines BL, BLX during the read operation and the write operation. The sense amplifier SA may be of a buffer type that amplifies the voltage of one of the bit lines BL, BLX.

The column switch CSW has a plurality of transistor switches (not shown) that connect the bit lines BL, BLX to data lines DIN, /DIN, DOUT, /DOUT via buffers BUF. When the write operation is executed, the column switch CSW and the buffers BUF directed upward in the drawing turn on, so that complementary write data DIN, /DIN are supplied to the bit lines BL, BLX. When the read operation is executed, the column switch CSW and the buffers BUF directed downward turn on, so that read data amplified on the bit lines BL, BLX are outputted as complementary data DOUT, /DOUT.

Figure 2:
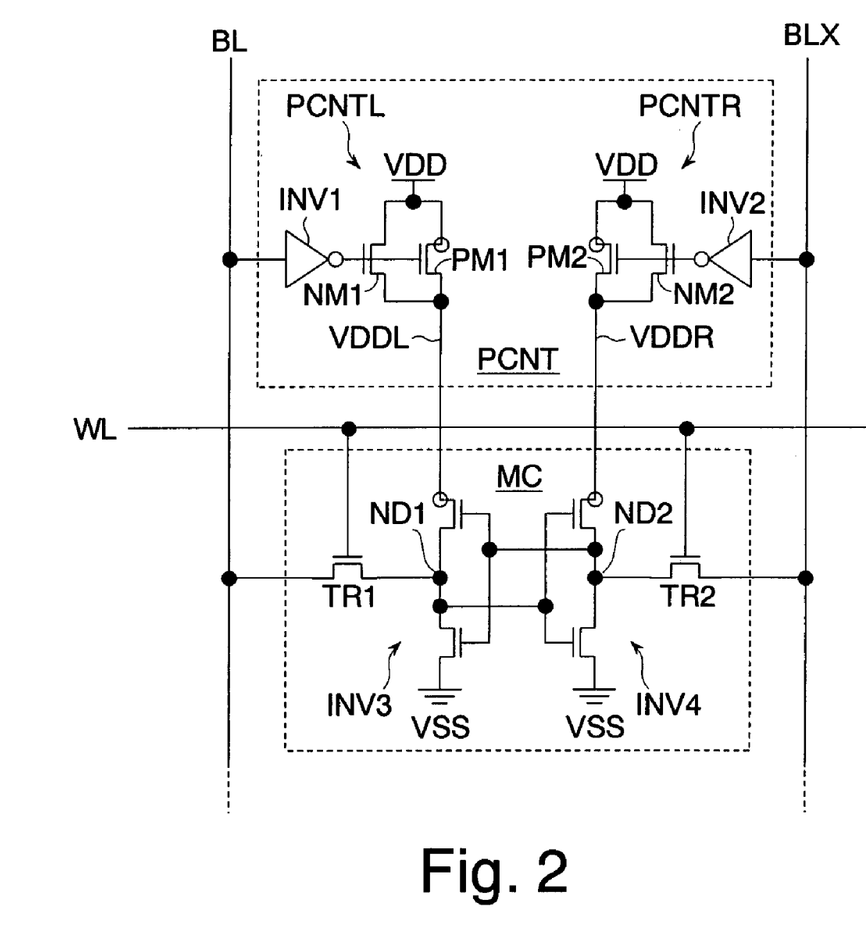
FIG. 2 is a circuit diagram showing details of a power control circuit shown in FIG. 1.

FIG. 2 shows details of the power control circuit PCNT shown in FIG. 1. The power control circuit PCNT has power control units PCNTL, PCNTR connected to the bit lines BL, BLX respectively. The power control units PCNTL, PCNTR have the same circuitry and are formed symmetrically.

The power control unit PCNTL has a CMOS inverter INV1 having an input connected to the bit line BL, an nMOS transistor NM1 and a pMOS transistor whose gates are connected to an output of the inverter INV1. The nMOS transistor NM1 has a source connected to the power supply line VDDL and a drain connected to an external power supply line VDD. The pMOS transistor PM1 has a source connected to the power supply line VDD and a drain connected to the external power supply line VDDL.

The power control unit PCNTR has a CMOS inverter INV2 having an input connected to the bit line BLX, and an nMOS transistor NM2 and a pMOS transistor PM2 whose gates are connected to an output of the inverter INV2. The nMOS transistor NM2 has a source connected to the power supply line VDDR and a drain connected to an external power supply line VDD. The pMOS transistor PM2 has a source connected to the power supply line VDD and a drain connected to the power supply line VDDR.

For example, the size of the pMOS transistors PM1-2 is set twice as large as the size of a pMOS transistor of the memory cell MC. Here, the size is expressed by a ratio W/L of a gate width W and a gate length L of the transistor. On-current of the PMOS transistors PM1-2 is large. Consequently, even if feedthrough current temporarily flows from the power supply lines VDDL, VDDR of later-described inverters INV3-4 of the memory cell MC to ground lines VSS during the write operation to the memory cell MC, it is possible to prevent the drop in the power supply voltages VDDL, VDDR of the inverters INV3-4. In particular, it is possible to prevent the drop in the power supply voltage of the inverter (one of INV3-4) to which high level is written, so that the write margin of the memory cell MC can be improved. The power control circuit PCNT is formed of eight transistors as shown in the drawing. Therefore, forming the power control circuit PCNT results in only a small increase in circuit scale.

The memory cell MC is a typical cell of a 6-transistor type. The memory cell MC has a pair of the CMOS inverters INV3, INV4 whose inputs and outputs are connected to each other, and transfer transistors TR1, TR2 (transfer switches) connecting storage nodes ND1-2, which are outputs of the inverters INV3-4, to the bit lines BL, BLX respectively. The inverters INV3-4 form a flipflop. Power supply terminals VDDL, VDDR of the inverters INV3, INV4 are connected to the power control units PCNTL, PCNTR respectively. The complementary data written to the memory cell MC are held in the storage nodes ND1-2 respectively.

Figure 3:
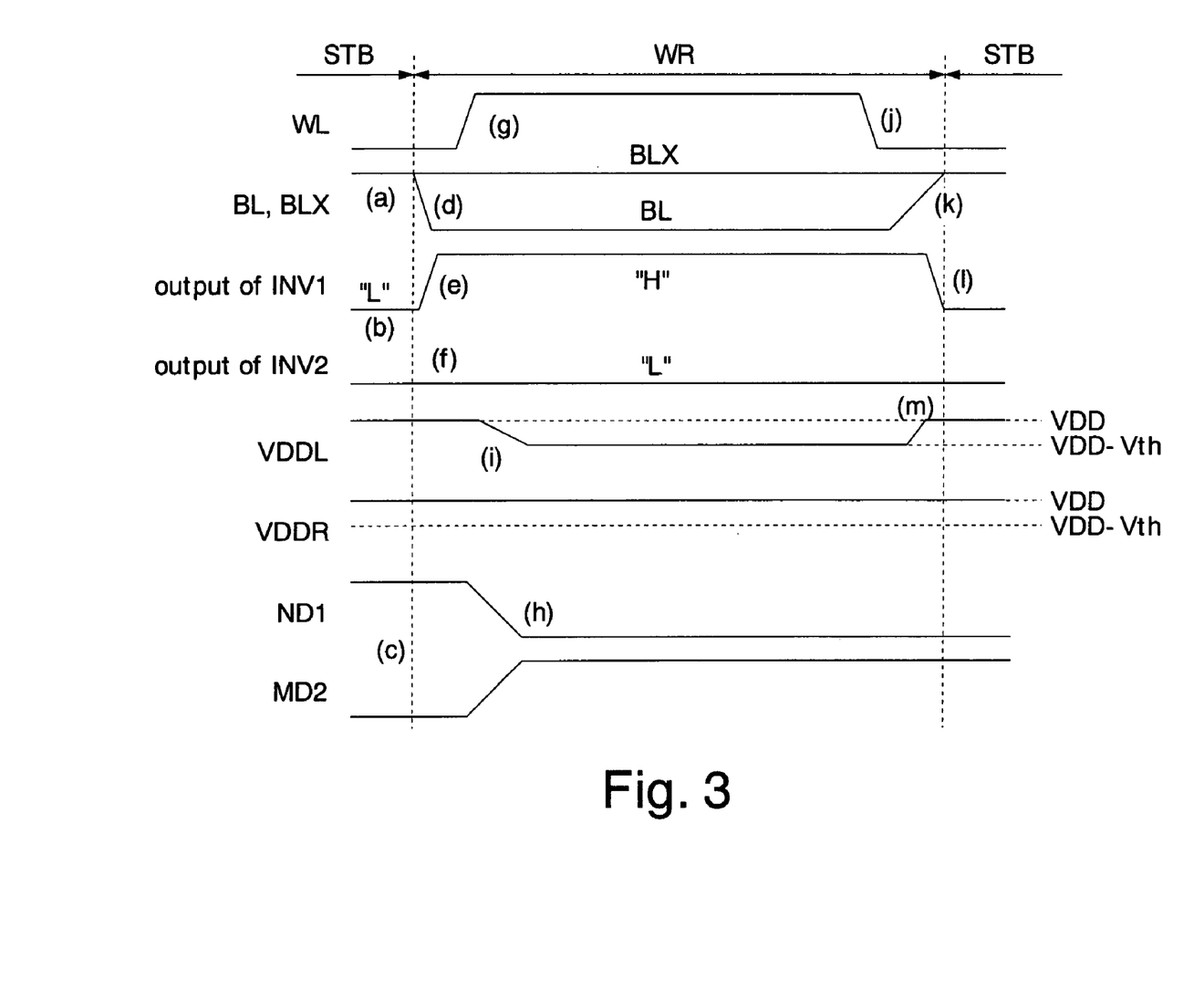
FIG. 3 is a timing chart showing a write operation of a SRAM of the first embodiment.

FIG. 3 shows a write operation of the SRAM of the first embodiment. Before the write operation (WR) is started (a standby period STB), the bit lines BL, BLX are precharged to high level (VDD) by the precharge circuit PRE (FIG. 3(a)). The inverters INV1-2 of the power control circuit PCNT shown in FIG. 2 receive the high level of the bit lines BL, BLX to output low level (L) (FIG. 3(b)). Consequently, the nMOS transistors NM1-2 turn off and the pMOS transistors PM1-2 turn on. In this example, before the write operation, the memory cell stores "logic 1", and the storage nodes ND1-2 are set to the high level (VDD) and the low level (VSS) respectively (FIG. 3(c)).

In the standby period STB, when the pMOS transistors PM1-2 turn on, the power supply terminals VDDL, VDDR of the inverters INV3-4 of the memory cell MC are set to the power supply voltage VDD (for example, 1.2 V). Therefore, even when the pMOS transistors PM1-2 are disposed between the power supply line VDD and the memory cell MC, the power supply voltage VDD can be supplied to the memory cell MC, so that the data stored in the memory cell MC can be surely held.

In the write operation, the complementary write data are first supplied to the bit lines BL, BLX from the data lines DIN, /DIN via the column switch CSW shown in FIG. 1. In this example, "logic 0" is written to an external data terminal, and the bit lines BL, BLX change to the low level (VSS) and the high level (VDD) respectively (FIG. 3(d)). The inverter INV1 of the power control unit PCNTL shown in FIG. 2 outputs the high level (H; VDD) in response to the change in the bit line BL (FIG. 3(e)). No change occurs in the output of the inverter INV2 of the power control unit PCNTR (FIG. 3(f)).

The pMOS transistor PM1 of the power control unit PCNTL turns off upon receiving the power supply voltage VDD at its gate. The power supply terminal VDDL of the inverter INV3 of the memory cell MC is set to the power supply voltage VDD until the pMOS transistor PM1 turns off. Therefore, a source voltage (VDDL) of the nMOS transistor NM1 is substantially equal to the power supply voltage VDD when its gate receives the power supply voltage VDD. Since a gate-source voltage of the nMOS transistor NM1 is substantially 0V, the nMOS transistor NM1 does not turn on. This brings the power supply terminal VDDL of the inverter INV3 into a high-level floating state.

After a write voltage is supplied to the bit lines BL, BLX, the word line WL is activated to high level (FIG. 3(g)). The activation of the word line WL causes the transfer transistors TR1-2 to turn on, so that the memory cell MC is accessed. The voltages of the storage nodes ND1-2 change according to the voltages of the bit lines BL, BLX (FIG. 3(h)). In a period during which the voltages of the storage nodes ND1-2 are an intermediate voltage (between the power supply voltage VDD and the ground voltage VSS), the voltage of the floating power supply terminal VDDL drops in accordance with the voltage drop of the node ND1 (FIG. 3(i)). The voltage of the power supply terminal VDDL drops to "the power supply voltage VDD—a threshold voltage Vth of the nMOS transistor NM1". In this embodiment, the threshold voltage Vth of the nMOS transistors NM1-2 is set to 0.3 V, and thus the voltage of the power supply terminal VDDL becomes 0.9 V.

Since the voltage of the power supply line VDDL of the inverter INV3 having the node ND1 to which the low level voltage is written is set lower than the power supply voltage VDD, power supply capability to the inverter INV3 lowers, which facilitates writing low-level data to the memory cell MC. Further, the power supply terminal VDDR of the inverter INV4 having the storage node ND2 to which the high level is written keeps receiving the power supply voltage VDD. Therefore, in the memory cell MC, a gate voltage of the nMOS transistor of the inverter INV3 can be raised to the power supply voltage VDD. This, as a result, facilitates the inversion of the flipflop constituted of the inverters INV3-4. That is, the write margin of the memory cell MC can be improved.

Thereafter, the word line WL is inactivated to low level (FIG. 3(j)). Next, the supply of the write data to the bit lines BL, BLX is stopped. The precharge circuit PRE operates to precharge the bit lines BL, BLX to the power supply voltage VDD (FIG. 3(k)). The change in the bit line BL to the power supply voltage VDD causes a change in the output of the inverter INV1 to the low level (VSS) (FIG. 3(l)). Consequently, the nMOS transistor NM1 turns off and the pMOS transistor PM1 turns on. When the pMOS transistor PM1 turns on, the voltage of the power supply line VDDL rises to the power supply voltage VDD (FIG. 3(m)). Then, the memory cell MC returns to the standby state STB, and the write operation is finished.

Note that, the power supply lines VDDL, VDDR are connected commonly to the memory cells MC arranged along the bit lines BL, BLX. Therefore, in the above-described example, the power supply line VDDL of the memory cells MC connected to the unselected word lines WL also changes to 0.9 V. However, the state of these memory cells MC is equivalent to the standby state STB since the transfer transistors TR1-2 are off. Therefore, these memory cells MC can surely hold data. The minimum value of the power supply voltages VDDL, VDDR to allow the memory cells MC to hold data is theoretically the threshold voltage of the transistors constituting the inverters INV3-4.

Figure 4:
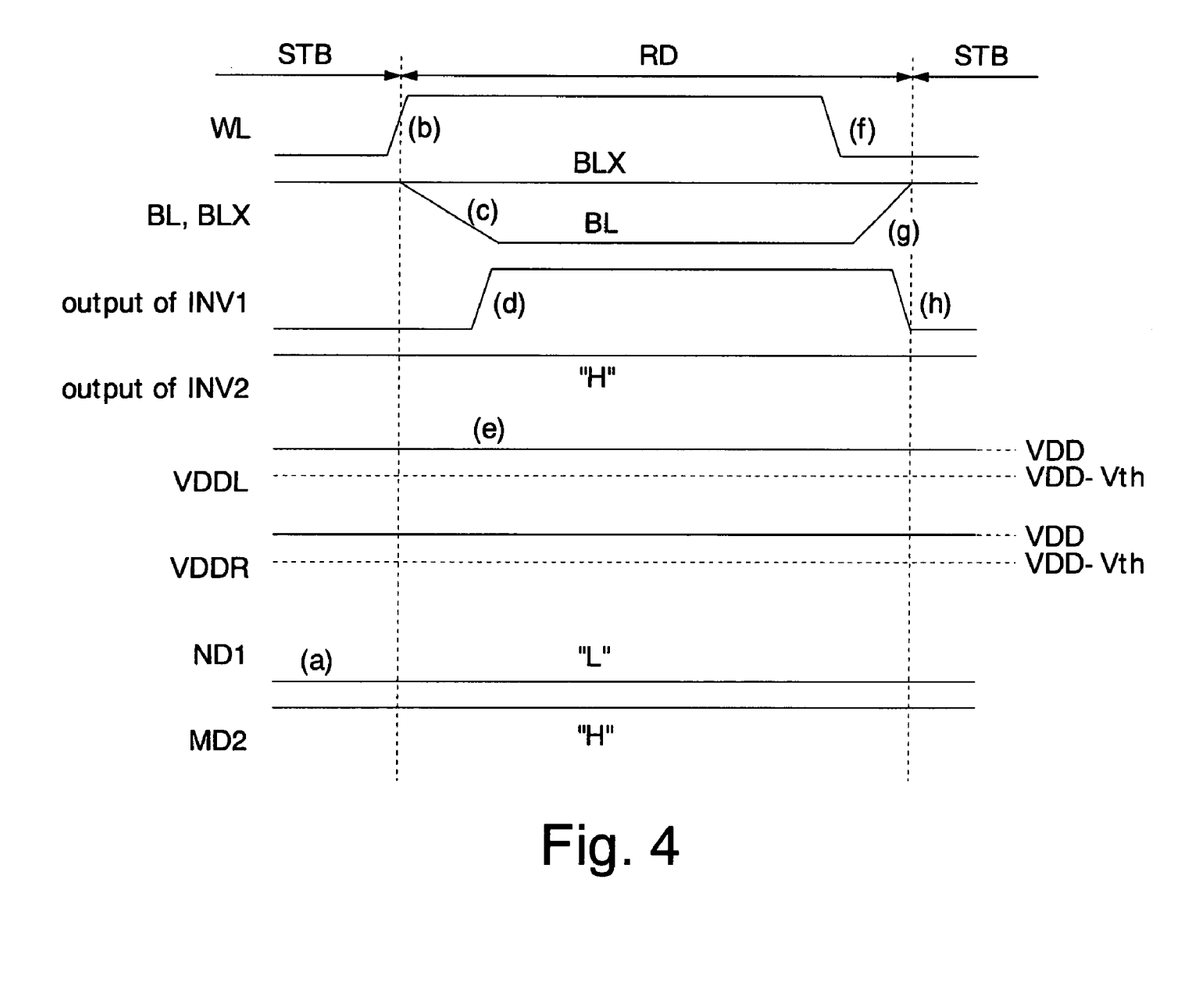
FIG. 4 is a timing chart showing a read operation of the SRAM of the first embodiment.

FIG. 4 shows a read operation of the SRAM of the first embodiment. In this example, before the read operation, the memory cell MC stores "logic 0", and the storage nodes ND1, ND2 are set to the low level (L; VSS) and the high level (H; VDD) respectively (FIG. 4(a)). The states other than the state of the storage nodes ND1, ND2 are the same as those before the write operation shown in FIG. 3.

In the read operation (a read period RD), the word line WL is first activated to the high level and the transfer transistors TR1-2 turn on (FIG. 4(b)). The low level and the high level of the storage nodes ND1-2 of the memory cell MC are transferred to the bit lines BL, BLX (FIG. 4(c)). The inverter INV1 of the power control circuit PCNT receives the low level of the bit line BL to output high level (FIG. 4(d)). Consequently, as in the above description of FIG. 3(e), the power supply terminal VDDL of the inverter INV3 is put into the high-level floating state. The memory cell MC has stored "logic 0" and the pMOS transistor of the inverter INV3 has been off. Therefore, the power supply voltage VDDL gradually drops due to OFF current (leakage current) of the pMOS transistor. Actually, the OFF current of the pMOS transistor is small, so that the power supply voltage VDDL is kept in the high-level floating state (FIG. 4(*e*)).

Since the source of the pMOS transistor of the inverter INV3 is kept in the floating state, the node ND1 is easily kept at low level. Therefore, it is possible to surely prevent the data held in the memory cell MC from being inverted due to ON of the transfer transistors TR1-2. That is, the read margin of the memory cell MC can be improved.

Thereafter, similarly to FIG. 3, the word line WL is inactivated to the low level, and the bit lines BL, BLX are precharged to the power supply voltage VDD (FIG. 4(*f, g*)). The change in the bit line BL to the power supply voltage VDD causes a change in the output of the inverter INV1 to the low level (VSS) (FIG. 4(*h*)). Consequently, the nMOS transistor NM1 turns off and the pMOS transistor PM1 turns on. When the pMOS transistor PM1 turns on, the power supply line VDDL is connected to the power supply line VDD, so that the memory cell MC returns to the standby state STB. That is, the read operation is finished.

Incidentally, also in the read operation, similarly to the above-described write operation, the transfer transistors TR1-2 of the memory cells connected to the unselected word lines WL are off, which is equivalent to the standby state STB. Therefore, these memory cells MC can surely hold data.

As described above, in the first embodiment, the power supply voltage VDDL supplied to the inverter (for example, INV3) of the memory cell MC to which the low level is written is set lower than the power supply voltage VDD, so that the write margin of the memory cell can be improved.

Figure 5:
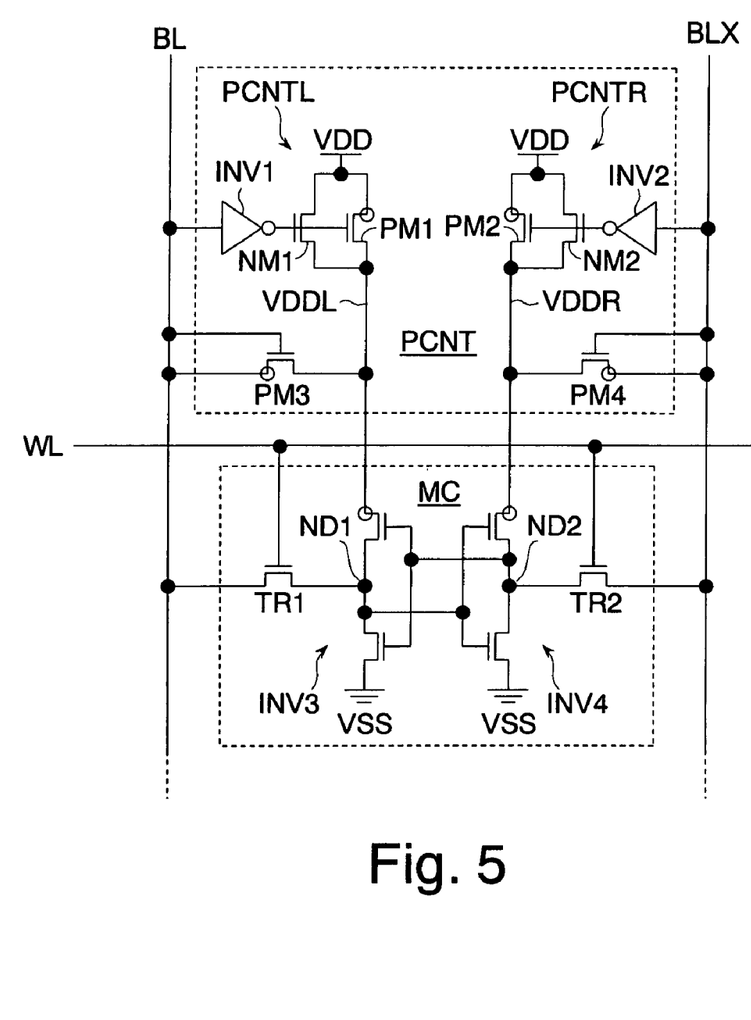
FIG. 5 is a circuit diagram showing details of a power control circuit in a second embodiment of the present invention.

FIG. 5 shows details of a power control circuit PCNT in a second embodiment. The same reference numerals and symbols are used to designate the same elements as those described in the first embodiment, and detailed description thereof will be omitted. The configuration except the power control circuit PCNT is the same as the configuration of the first embodiment (FIG. 1).

The power control circuit PCNT is configured such that pMOS transistors PM3, PM4 are added to the power control circuit PCNT of the first embodiment. The pMOS transistor PM3 has a source connected to a power supply line VDDL, and a drain and a gate connected to a bit line BL. The pMOS transistor PM4 has a source connected to a power supply line VDDR and a drain and a gate connected to a bit line BLX.

The PMOS transistor PM3 (or PM4) operates as a connection switch that passes current from the power supply line VDDL (or VDDR) to the bit line BL (or BLX) when the bit line BL (or BLX) is at low level. For example, the size of the pMOS transistors PM3-4 is set half the size of a pMOS transistor of a memory cell MC. Therefore, even when the pMOS transistors PM3-4 are formed, an increase in circuit scale can be suppressed to the minimum.

Figure 6:
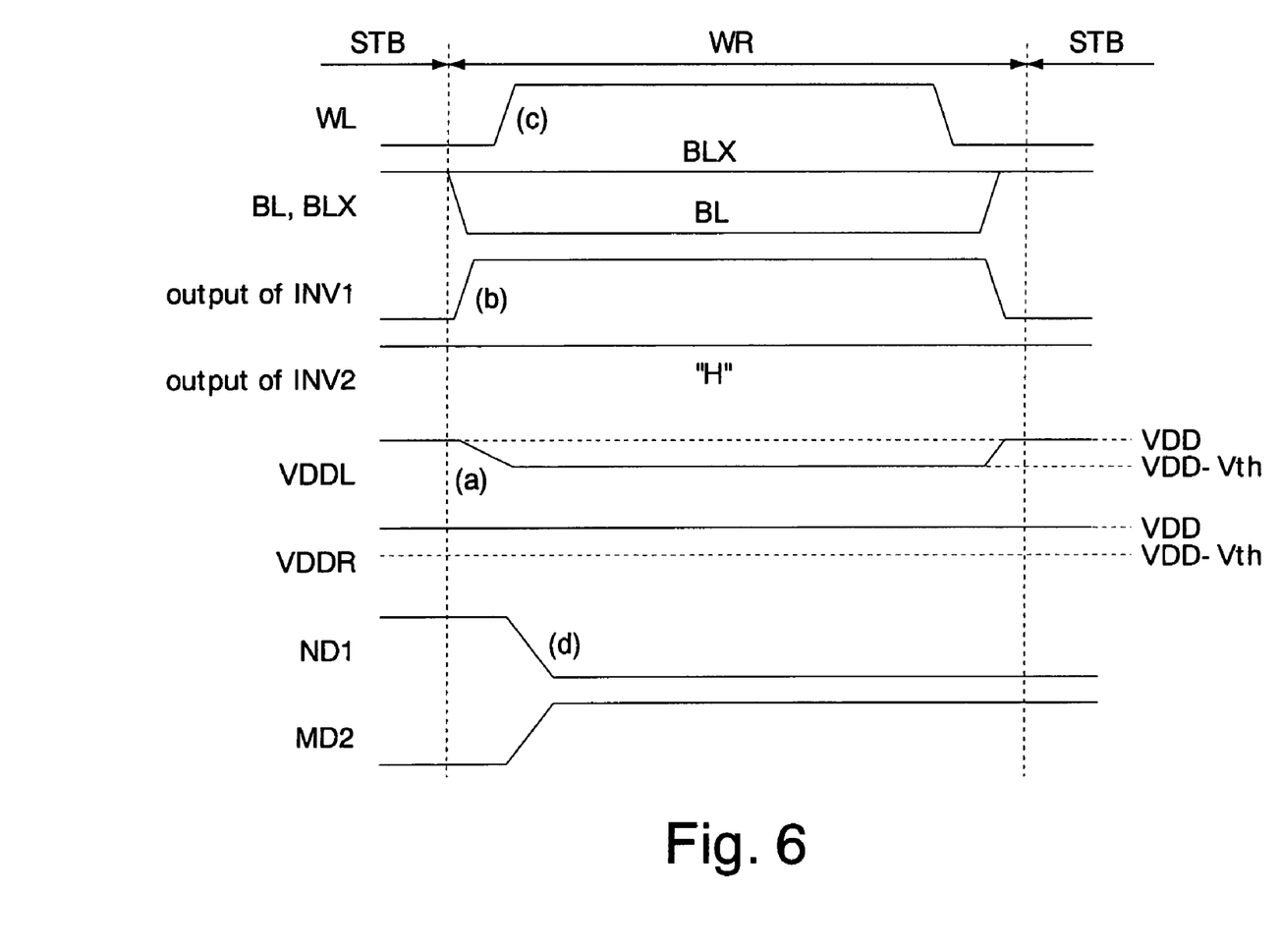
FIG. 6 is a timing chart showing a write operation of a SRAM of the second embodiment.

FIG. 6 shows a write operation in a SRAM of the second embodiment. The same operations as those of the first embodiment (FIG. 3) will not be described in detail. In this embodiment, when low-level write data is supplied to the bit line BL, the pMOS transistor PM3 turns on and a power supply voltage VDDL drops (FIG. 6(*a*)). A gate of an nMOS transistor NM1 of the power control circuit PCNT receives high level (FIG. 6(*b*)). Consequently, the power supply voltage VDDL drops to "a power supply voltage VDD—a threshold voltage Vth of the nMOS transistor NM 1". In this embodiment, since the power supply voltage VDD is set to 1.2 V and the threshold voltage Vth of the nMOS transistors NM1-2 is set to 0.3 V, the voltage of a power supply terminal VDDL becomes 0.9 V.

Thereafter, a word line WL is activated to high level (FIG. 6(*c*)). The activation of the word line WL causes the voltage of storage nodes ND1-2 to change in accordance with the voltages of the bit lines BL, BLX (FIG. 6(*d*)). The power supply voltage VDDL is lower than the power supply voltage VDD before the word line WL is activated. Therefore, the storage node ND1 changes to low level in a short time.

Since the storage node ND1 is connected to an input of an inverter INV4 having the storage node ND2, the time taken for the voltage of the storage node ND2 to change is also short. That is, the data writing time to the memory cell MC can be shortened. Since a period during which the storage nodes ND1-2 are kept at an intermediate voltage (between the power supply voltage VDD and a ground voltage VSS) is shortened, feedback current does not easily pass through the inverters INV3-4.

Further, as shown in FIG. 1, when the plural memory cells MC share the power control circuit PCNT, wiring of the power supply lines VDDL, VDDR is lengthened, resulting in larger load capacitance thereof. Also in this case, the voltages of the nodes ND1-2 can be quickly changed by the pMOS transistors PM3-4.

Figure 7:
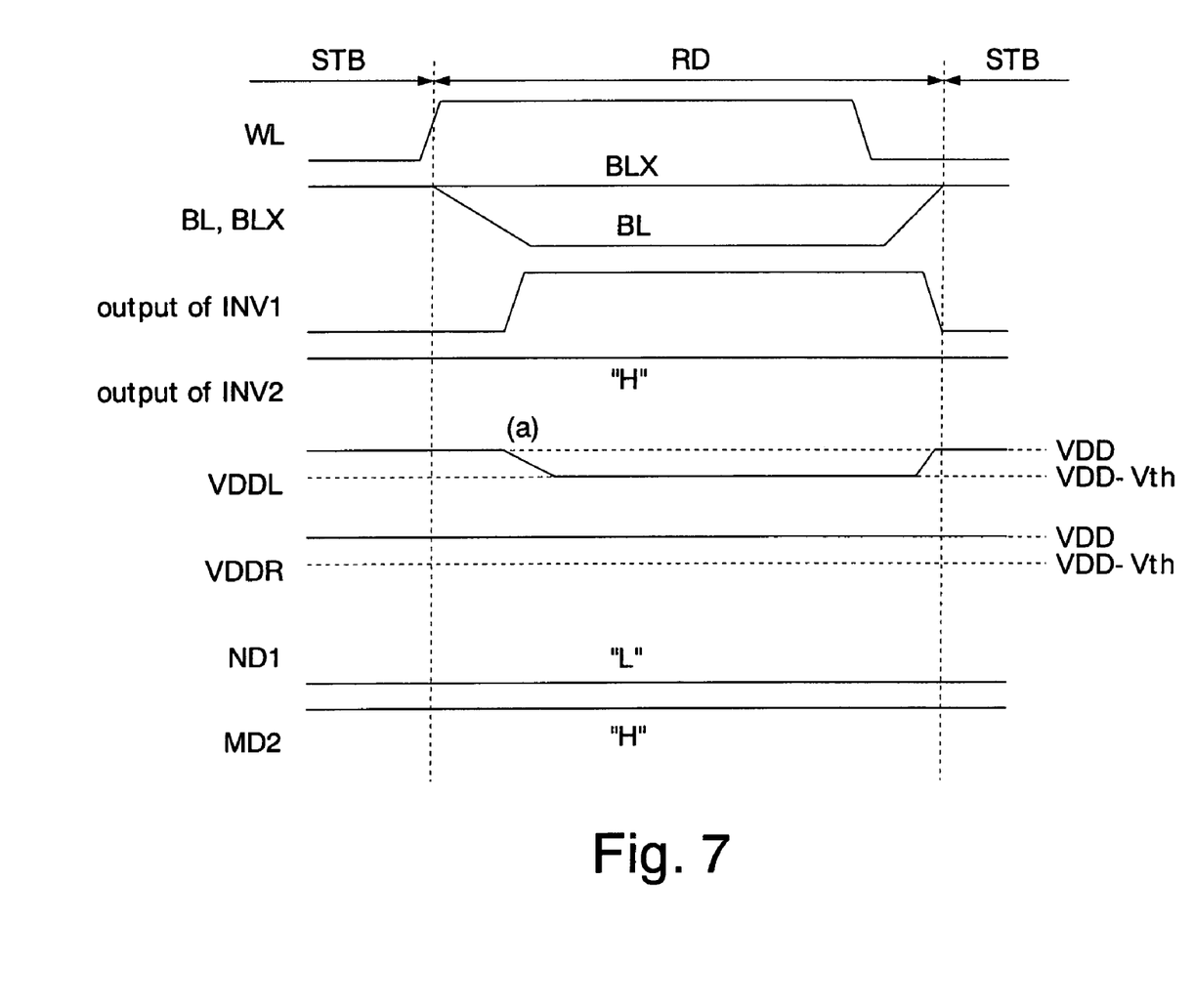
FIG. 7 is a timing chart showing a read operation of the SRAM of the second embodiment.

FIG. 7 shows a read operation in the SRAM of the second embodiment. The same operations as those of the first embodiment (FIG. 4) will not be described in detail. In this embodiment, the power supply lines VDDL, VDDR are connected to the bit lines BL, BLX via the pMOS transistors PM3-4. Therefore, the power supply line VDDL (or VDDR) changes to "VDD-Vth" in accordance with the change in the bit line BL (or BLX) to the low level (FIG. 7(*a*)).

However, the power supply line VDDL (or VDDR) that changes to the low level is connected to the inverter INV3 (or INV4) that outputs low level in the memory cell. Therefore, during the read operation (a read period RD), the inverter V3 (or INV4) is easily kept at the low level. Therefore, the read margin of the memory cell MC can be improved.

The second embodiment described above can also provide the same effects as those of the first embodiment. In addition, adding the PMOS transistors PM3-4 to the power control circuit PCNT makes it possible to shorten the writing time to improve the write margin. In particular, this embodiment is effective when the power control circuit PCNT is shared by the plural memory cells.

Figure 8:
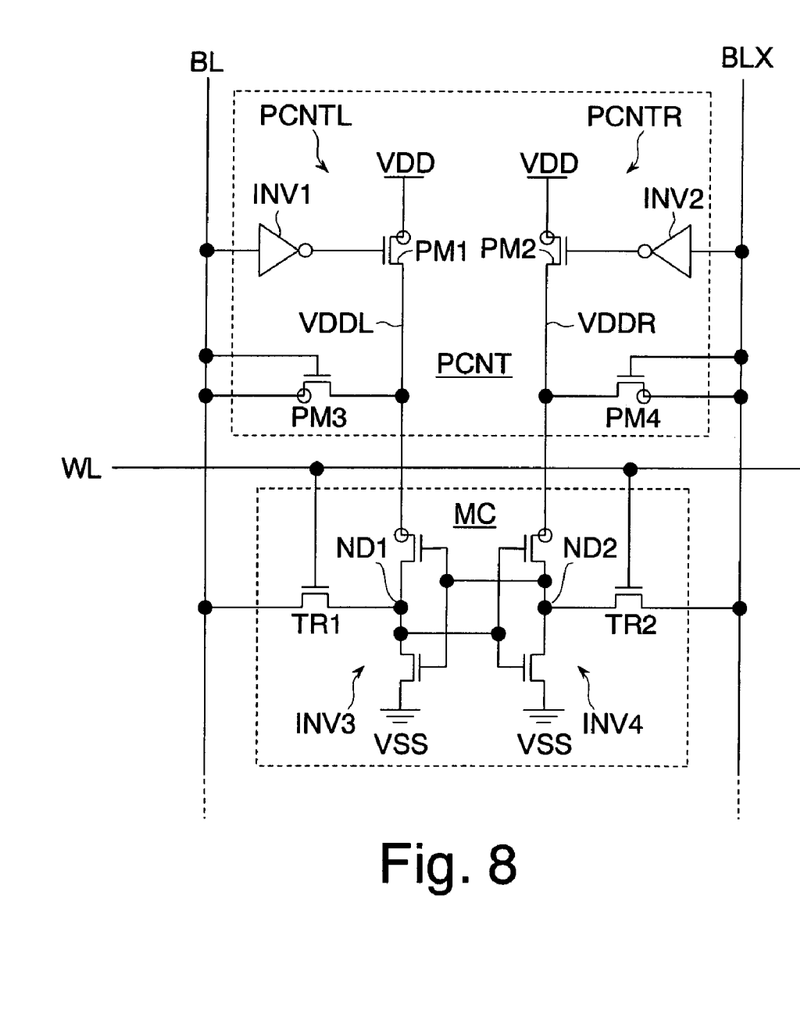
FIG. 8 is a circuit diagram showing details of a power control circuit in a third embodiment of the present invention.

FIG. 8 shows details of a power control circuit PCNT in a third embodiment of the present invention. The same reference numerals and symbols are used to designate the same elements as those described in the first and second embodiments, and detailed description thereof will be omitted. The configuration except the power control circuit PCNT is the same as that of the first embodiment (FIG. 1).

The power control circuit PCNT is configured such that the nMOS transistors NM 1 -2 are removed from the power control circuit PCNT of the second embodiment. Therefore, in a write operation and a read operation, a power supply line VDDL (or VDDR) corresponding to a low-level bit line BL (or BLX) is set to a floating state. However, the power supply line VDDR (or VDDL) corresponding to a high-level bit line BLX (or BL) is set to a power supply voltage VDD. Therefore, the write margin and the read margin can be improved as described above. The third embodiment described above can also provide the same effects as those of the first and second embodiments.

Figure 9:
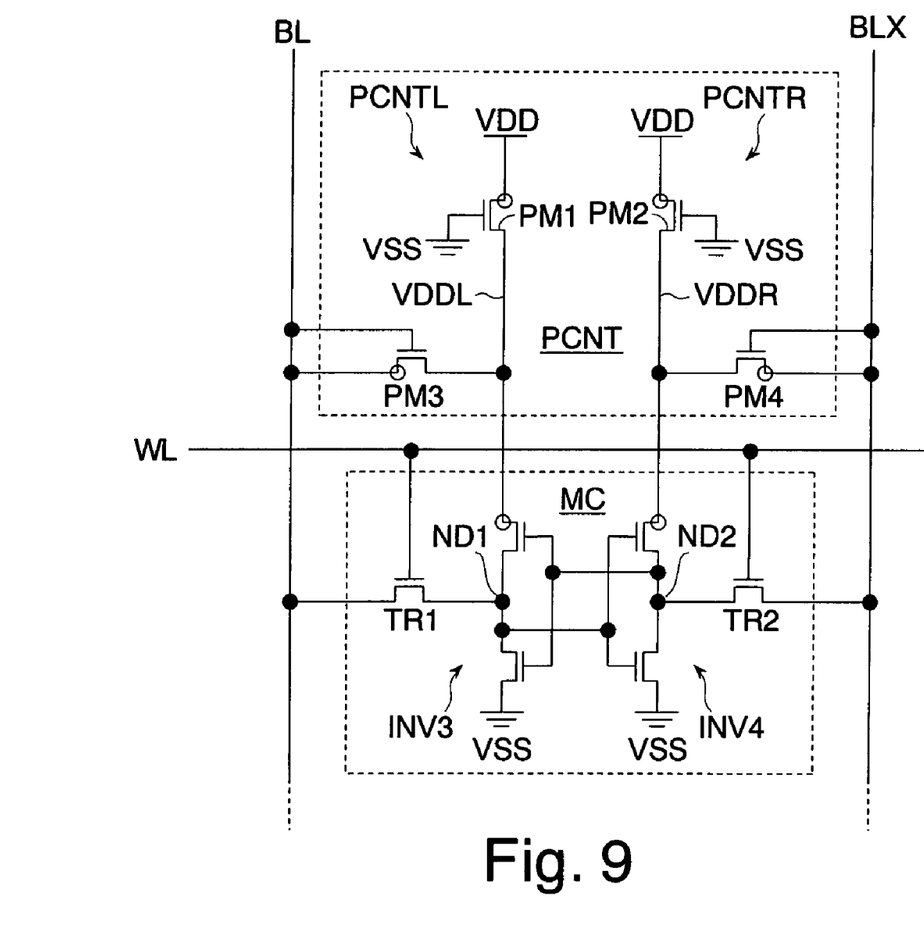
FIG. 9 is a circuit diagram showing details of a power control circuit in a fourth embodiment of the present invention.

FIG. 9 shows details of a power control circuit PCNT in a fourth embodiment of the present invention. The same reference numerals and symbols are used to designate the same elements as those described in the first and second embodiments, and detailed description thereof will be omitted. The configuration except the power control circuit PCNT is the same as that of the first embodiment (FIG. 1).

The power control circuit PCNT is configured such that the inverters INV1-2 and the nMOS transistors NM1-2 are removed from the power control circuit PCNT of the second embodiment. Gates of pMOS transistors PM1-2 are connected to ground lines VSS. Therefore, the pMOS transistors PM1-2 operate as resistors. Also in this embodiment, during a write operation and a read operation, a power supply voltage VDDL (or VDDR) corresponding to a low-level bit line BL (or BLX) can be made lower than a power supply voltage VDD. In addition, the power supply voltage VDDR (or VDDL) corresponding to a high-level bit line BLX (or BL) is set to the power supply voltage VDD. Therefore, the fourth embodiment can also provide the same effects as those of the first and second embodiments.

Incidentally, the above embodiments have described the examples where one power control circuit PCNT is disposed for each bit line pair BL, BLX. However, when the number of memory cells MC connected to the bit line pair BL, BLX is large and thus the bit line pair BL, BLX is long, the plural power control circuits PCNT may be disposed for each bit line pair BL, BLX.

The above second—fourth embodiments have described the examples where the connection switches connecting the power supply lines VDDI, VDDR to the bit lines BL, BLX are constituted of the PMOS transistors PM3, PM4. However, the connection switches may be constituted by CMOS transmission gates constituted of a pair of a pMOS transistor and an nMOS transistor. In this case, a gate of the nMOS transistor corresponding to the bit line BL is connected to, for example, the bit line BLX.

The above embodiments have described the examples where the low level is written to the bit line BL. However, in the present invention, the structures of the power control units PCNTL, PCNTR are symmetrical to each other, and therefore, even when the low level is written to the bit line BLX, the operations are the same, so that the same effects can be obtained.

The invention is not limited to the above embodiments and various modifications may be made without departing from the spirit and scope of the invention. Any improvement may be made in part or all of the components.

What is claimed is:

1. A semiconductor memory comprising:
    a plurality of memory cells each having a pair of inverters whose inputs and outputs are connected to each other, and holding complementary data respectively in storage nodes which are the outputs of the inverters;
    a power control circuit which sets a power supply voltage of the inverter having a storage node to which low level is written, to be lower than a power supply voltage of the inverter having a storage node to which high level is written, in a write operation during which the complementary data are written to said storage nodes, respectively; and
    complementary bit lines connected to the storage nodes of said inverters via transfer switches, respectively; wherein:
    said power control circuit receives write voltages supplied to said bit lines, to supply the power supply voltage to each of said inverters according to the received write voltages;
    said power control circuit has a pair of power control units connected to power supply terminals of each of said inverters, respectively; and
    each of said power control units has an nMOS transistor and a pMOS transistor arranged in parallel between an external power supply line and each of the power supply terminals and receiving at their gates a voltage that is an inverted voltage level of each of the bit lines.

2. The semiconductor memory according to claim 1, wherein:
    each of said inverters is formed of a pMOS transistor and an nMOS transistor that are connected in series; and
    the pMOS transistor of each of said power control units has a larger size than the pMOS transistor of each of said inverters to allow larger ON current to flow through.

3. The semiconductor memory according to claim 1, further comprising
    a precharge circuit precharging said bit lines to a high level in a standby period during which said memory cells are not accessed.

4. A semiconductor memory comprising:
    a plurality of memory cells each having a pair of inverters whose inputs and outputs are connected to each other and holding complementary data respectively in storage nodes which are the outputs of the inverters;
    a power control circuit which sets a power supply voltage of the inverter having a storage node to which low level is written to be lower than a power supply voltage of the inverter having a storage node to which high level is written, in a write operation during which the complementary data are written to said storage nodes, respectively; and
    complementary bit lines connected to the storage nodes of said inverters via transfer switches, respectively, wherein
    said power control circuit receives write voltages supplied to said bit lines, to supply the power supply voltage to each of said inverters according to the received write voltages; and wherein
    said power control circuit has connection switches each connecting the power supply terminal of one of said inverters to one of said bit lines when receiving a low-level write voltage supplied to one of said bit lines.

5. The semiconductor memory according to claim 4, wherein
    said power control circuit is formed commonly for said memory cells connected to said bit lines.

6. The semiconductor memory according to claim 4, wherein
    each of said connection switches includes a pMOS transistor having a gate connected to one of said bit lines, a source connected to said power supply terminal, and a drain connected to one of said bit lines.

7. The semiconductor memory according to claim 1, wherein
    said power control circuit is formed commonly for said memory cells connected to said bit lines.

* * * * *